United States Patent
Schaeffer et al.

(10) Patent No.: US 8,415,212 B2
(45) Date of Patent: Apr. 9, 2013

(54) METHOD OF ENHANCING PHOTORESIST ADHESION TO RARE EARTH OXIDES

(75) Inventors: James K. Schaeffer, Austin, TX (US); Eric D. Luckowski, Round Rock, TX (US); Todd C. Bailey, Poughkeepsie, NY (US); Amy L. Child, Hopewell Junction, NY (US); Daniel Jaeger, Wappingers Falls, NY (US); Renee Mo, Briarcliff Manor, NY (US); Ying H. Tsang, Katy, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 435 days.

(21) Appl. No.: 12/721,738

(22) Filed: Mar. 11, 2010

(65) Prior Publication Data

US 2011/0223756 A1    Sep. 15, 2011

(51) Int. Cl.
H01L 21/8238 (2006.01)
H01L 21/3205 (2006.01)

(52) U.S. Cl. ........ 438/199; 438/287; 438/591; 438/669; 438/722; 257/E21.632

(58) Field of Classification Search ........... 438/591, 438/199, 287, 240, 669, 722; 257/E21.632
See application file for complete search history.

(56) References Cited

U.S. PATENT DOCUMENTS

| | | | |
|---|---|---|---|
| 6,448,185 B1 | 9/2002 | Andideh et al. | |
| 6,720,247 B2* | 4/2004 | Kirkpatrick et al. | 438/622 |
| 7,498,271 B1 | 3/2009 | Donaton et al. | |
| 2007/0178637 A1* | 8/2007 | Jung et al. | 438/216 |
| 2008/0176388 A1* | 7/2008 | Carter | 438/585 |
| 2009/0152636 A1 | 6/2009 | Chudzik et al. | |

OTHER PUBLICATIONS

T. Schram et al., Novel Process to Pattern Selectively Dual Dielectric Capping Layers Using Soft-Mask Only, Symposium on VLSI Technology Digest of Technical Papers, 2008.
J.K. Schaeffer et al., U.S. Appl. No. 12/365,317, entitled CMOS Integration with Metal Gate and Doped High-K Oxides, filed Feb. 4, 2009.

* cited by examiner

*Primary Examiner* — Michael Trinh
(74) *Attorney, Agent, or Firm* — Hamilton & Terrile, LLP; Michael Rocco Cannatti

(57) ABSTRACT

A method and apparatus are described for fabricating metal gate electrodes (85, 86) over a high-k gate dielectric layer (32) having a rare earth oxide capping layer (44) in at least the NMOS device area by treating the surface of a rare earth oxide capping layer (44) with an oxygen-free plasma process (42) to improve photoresist adhesion, forming a patterned photoresist layer (52) directly on the rare earth oxide capping layer (44), and then applying a wet etch process (62) to remove the exposed portion of the rare earth oxide capping layer (44) from the PMOS device area.

20 Claims, 3 Drawing Sheets

METHOD OF ENHANCING PHOTORESIST ADHESION TO RARE EARTH OXIDES

BACKGROUND OF THE INVENTION

1. Field of the Invention

The present invention is directed in general to the field of semiconductor devices. In one aspect, the present invention relates to the fabrication of high-k metal gate semiconductor devices.

2. Description of the Related Art

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology is increasingly replacing silicon dioxide gate dielectrics and polysilicon gate conductors with high dielectric constant (high-k) dielectrics in combination with metal gate electrodes formed from a gate stack of polysilicon and one or more metal layers. With such technologies, the metal gate layers not only obviate gate-depletion and boron-penetration effects, but also provide a significantly lower sheet resistance.

While high-k dielectrics in conjunction with metal gate electrodes advantageously exhibit improved transistor performance, the use of new gate electrode technologies can create new technical challenges. For example, when high-k capping dielectric layers (e.g., $La_2O_3$) are to be selectively formed over only portions of the device substrate, conventional techniques have called for the application and patterning of photoresist materials directly on top of the high-k capping dielectric layer in areas to be protected against wet etching, but this often results in poor adhesion and cracking of the photoresist layer. Attempts have been made to promote photoresist adhesion, but such techniques are ill-suited for use with high-k gate dielectric materials (such as $HfO_2$) or have otherwise not proven workable. For example, ozone and $O_2$-based plasmas have been used to help oxidize surfaces and promote adhesion with photoresist, but such oxygen-based plasmas cause interface layer re-growth which increases the gate oxide inversion thickness (Tinv) and can not be used to promote photoresist adhesion at this level. In addition, developable bottom antireflective coating (dBARC) photoresist layers have been proposed for application directly to the dielectric capping layers to avoid photoresist adhesion problems, but it is difficult to control the photoresist profiles with currently-available dBARCs which typically result in more defects than conventional photoresists. Other approaches of improving adhesion—including using an adhesion promoter (e.g., hexamethyldisilazane), post-develop bake recipes, and other modifications to the litho track recipes—have only shown minor improvements.

Accordingly, a need exists for an improved metal gate electrode and manufacture method for incorporated very thin high-k gate dielectric materials in NMOS and PMOS that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
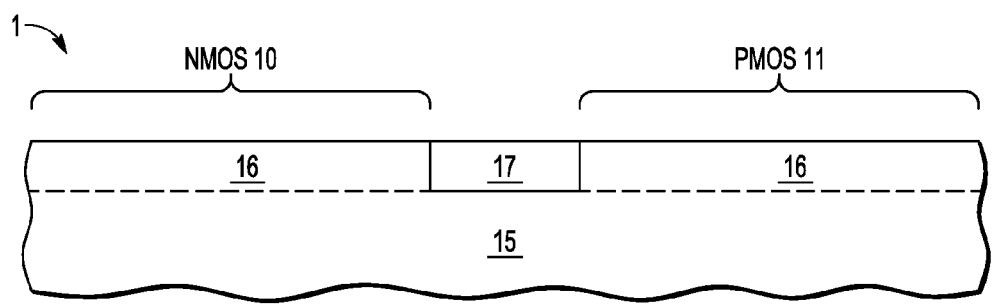
FIG. 1 is a partial cross-sectional view of a semiconductor wafer structure including a semiconductor layer having a first crystalline structure.

A method and apparatus are described for fabricating high-k metal gate transistors by using an oxygen-free plasma surface treatment to promote adhesion between a photoresist layer and an underlying high-k gate dielectric layer (e.g., $La_2O_3$). In selected embodiments, an oxygen-free ash (e.g., $H_2N_2$) is applied to modify the surface chemistry of a rare earth capping gate oxide layer (e.g., $La_2O_3$) to promote adhesion with a subsequently deposited patterned photoresist layer, without causing undesired oxidation and Tinv increase in the finally formed transistor devices, without causing damage to the underlying gate dielectric layer (e.g., $HFO_2$), or without leaving behind an undesired residue on the dielectric surface. Insofar as an $H_2N_2$ ash is a reducing ambient, the disclosed surface treatment process is believed to produce a more hydrophobic surface that improves adhesion between the photoresist layer and the underlying rare earth capping gate oxide layer. In addition, the disclosed integration scheme allows for photoresist rework, and results in the formation of a metal gate and high-k gate dielectric gate electrodes having low defectivity. In an example process flow, a semiconductor wafer structure is provided having a high-k gate dielectric layer (e.g., $HfO_2$) formed on a substrate layer. After depositing a thin (e.g., 2-5 Angstroms) first capping oxide layer (e.g., $La_2O_3$), an oxygen-free ash (e.g., $H_2N_2$) is applied to chemically modify the surface of the first capping oxide layer is in a manner that promotes better adhesion with subsequently formed photoresist. In particular, the NMOS device area is then masked with a patterned photoresist layer that adheres to the treated first capping oxide layer, and the exposed first capping oxide layer in the PMOS device area is selectively cleared with a wet etch process while leaving the first capping oxide layer over the NMOS device area. Subsequently, a single metal layer (e.g., TiN) and polysilicon layer are sequentially formed or deposited over the NMOS and PMOS device areas, and then selectively etched to form PMOS and NMOS gate electrodes having high-k gate dielectric layers that are separately doped to tune the threshold voltages.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, it is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Referring now to FIG. 1, there is shown a partial cross-sectional view of a semiconductor wafer structure 1. The structure 1 includes a semiconductor layer 16 formed on or as part of a semiconductor substrate 15 that has a first crystallographic orientation. Also illustrated is a shallow trench isolation 17 that divides the layer 16 into separate regions. Depending on the type of transistor device being fabricated, the semiconductor layer 15, 16 may be implemented as a bulk silicon substrate, single crystalline silicon (doped or undoped), semiconductor on insulator (SOI) substrate, or any semiconductor material including, for example, Si, SiC, SiGe, SiGeC, Ge, GaAs, InAs, InP, as well as other III/V or II/VI compound semiconductors or any combination thereof, and may optionally be formed as the bulk handling wafer. The semiconductor layer 15, 16 has a channel crystallographic orientation of <100>. Although not shown, the materials of layer 16 for NMOS and PMOS device areas 10, 11 may be different. And for any FET type (NMOS or PMOS), the layer 16 may consist of multiple stacks of materials. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor.

The isolation regions or structures 17 are formed to electrically isolate the NMOS device area(s) 10 from the PMOS device area(s) 11. Isolation structures 17 define lateral boundaries of an active region or transistor region 10, 11 in active layer 16, and may be formed using any desired technique, such as selectively etching an opening in the second semiconductor layer 16 using a patterned mask or photoresist layer (not shown), depositing a dielectric layer (e.g., oxide) to fill the opening, and then polishing the deposited dielectric layer until planarized with the remaining second semiconductor layer 16. Any remaining unetched portions of the patterned mask or photoresist layer(s) are stripped.

Figure 2:
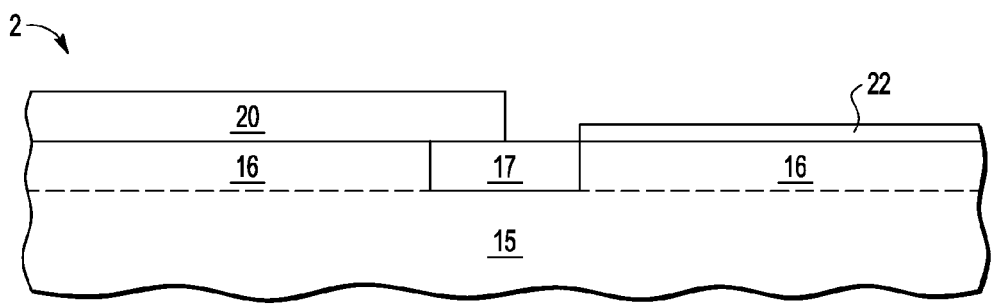
FIG. 2 illustrates processing subsequent to FIG. 1 where a masking layer is formed over NMOS areas of the semiconductor wafer structure and an epitaxial SiGe layer is selectively formed over PMOS areas of the semiconductor wafer structure.

FIG. 2 illustrates processing of a semiconductor wafer structure 2 subsequent to FIG. 1 where a patterned masking layer 20 is selectively formed over NMOS areas 10 of the semiconductor wafer structure and an epitaxial SiGe layer 22 is selectively formed over PMOS areas 11 of the semiconductor wafer structure. For example, one or more masking layers 20 (e.g., an oxide layer and/or nitride layer) may be deposited and/or grown over the semiconductor wafer structure, and then conventional patterning and etching techniques may be used to form an opening in the mask layer(s) 20 that exposes at least the PMOS device area 11. The selectively formed masking layer 20 is used to define and differentiate active regions for NMOS and PMOS devices subsequently formed on the wafer structure 16. After forming the patterned masking layer 20, a thin, compressively stressed semiconductor layer 22 is selectively formed over the PMOS area(s) 11 of the semiconductor wafer structure that will be used to form PMOS devices. In selected embodiments, the thin, compressively stressed semiconductor layer 22 is formed with a semiconductor material having larger atom-to-atom spacing than the underlying second semiconductor layer 16, such as SiGe, SiGeC, or combinations and composition by weight thereof, which is capable of being formed utilizing a selective epitaxial growth method or other deposition methods accompanied by subsequent re-crystallization. For example, if PMOS devices are formed over the semiconductor layer 16 in the PMOS area 11 and the semiconductor material for layer 16 is silicon, the semiconductor layer 22 may be formed by epitaxially growing a SiGe layer that is thinner than a critical relaxation thickness to form a compressive SiGe layer 22 having a lattice spacing the same as the semiconductor layer 16. This epitaxial growth may be achieved by a process of chemical vapor deposition (CVD) at a chamber temperature between 400 and 900° C. in the presence of silane, disilane, or dichlorosilane, and germane ($GeH_4$), HCl, and hydrogen gas. So long as the thickness of the SiGe layer 22 is below the critical relaxation thickness, the SiGe layer 22 is compressively stressed. As will be appreciated, the critical relaxation thickness for a SiGe layer will depend on the amount of germanium contained in the layer 22, though in an example embodiment, an epitaxially grown SiGe layer 22 that is approximately 50 Angstroms or less will have a uniform compressive stress. Because the lattice spacing of the silicon germanium is normally larger than the lattice spacing of the underlying silicon semiconductor layer 16, one advantage of forming the semiconductor layer 22 with compressive silicon germanium is that there is no stress induced on the silicon semiconductor layer 16. Another advantage of forming a relatively thin semiconductor layer 22 is to minimize the step height difference between the finally formed NMOS and PMOS device areas 10, 11, thereby improving processing uniformity between the two areas. While not shown, the silicon germanium layer 22 may be provided with a uniform grading or concentration of germanium as a function of depth, and there may also be a silicon cap layer formed or epitaxially grown over the silicon germanium layer 22 in the PMOS area(s) 11 of the semiconductor wafer structure which increases the threshold voltage and the subthreshold slope while improving hole mobility as compared to an un-capped SiGe channel region by providing a silicon/dielectric interface that has lower channel defectivity or interface trap density (Dit). In addition, it will be appreciated that the silicon germanium layer 22 can be omitted in selected embodiments, and in other embodiments, an additional layer of material (e.g., silicon carbide) can be formed over the NMOS areas 1 of the semiconductor wafer structure.

Figure 3:
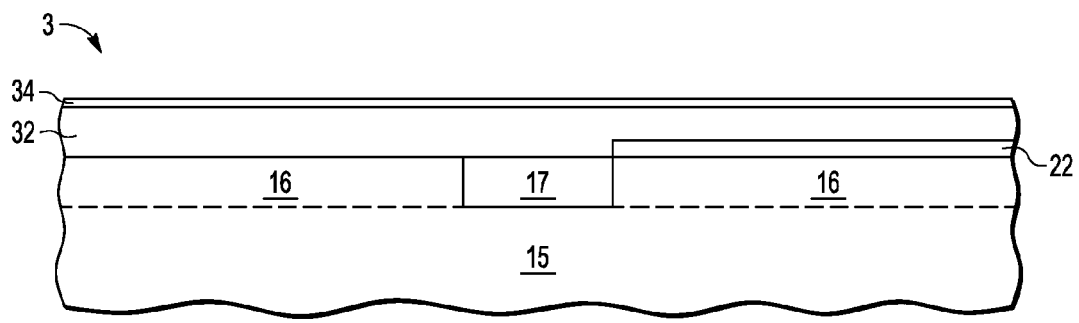
FIG. 3 illustrates processing subsequent to FIG. 2 after a high-k gate dielectric layer and first capping oxide layer are sequentially disposed over the semiconductor wafer structure.

FIG. 3 illustrates processing of a semiconductor wafer structure 3 subsequent to FIG. 2 after the mask layer 20 is removed, and a gate dielectric layer 32 and first capping oxide layer 34 are sequentially disposed over the NMOS and PMOS areas 10, 11. In selected embodiments, the gate dielectric layer 32 is formed by depositing or growing an insulator or high-k dielectric (e.g., silicon dioxide, oxynitride, metal-oxide, nitride, etc.) over the semiconductor substrate 3 using chemical vapor deposition (CVD), plasma-enhanced chemical vapor deposition (PECVD), physical vapor deposition (PVD), atomic layer deposition (ALD), thermal oxidation, or any combination(s) of the above. In an illustrative implementation, first dielectric layer 32 is a metal-oxide compound formed by chemical vapor deposition, physical vapor deposition, or by atomic layer deposition having a typical final thickness is in the range of 0.1-10 nanometers, though other thicknesses may be used. A suitable metal oxide compound for use as first dielectric layer 32 is a hafnium-based dielectric, such as hafnium oxide (preferably $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $ZrHfOx$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties. As will be appreciated, a high-k dielectric material is an insulator material having a dielectric constant value which is a measure of how much charge a material can hold, and will typically have a dielectric constant value above 3.9, the value of silicon dioxide.

After forming the gate dielectric layer 32, a first capping oxide layer 34 is disposed on the gate dielectric layer 32 over the NMOS and PMOS areas 10, 11. The first capping oxide layer 34 will provide a first dopant species for doping the gate dielectric layer 32 in the NMOS device area 10. In selected embodiments, the first capping oxide layer 34 is formed using any desired deposition or sputtering process, such as CVD, PECVD, PVD, ALD, molecular beam deposition (MBD) or any combination(s) thereof. A suitable metal oxide compound for use as the first capping oxide layer 34 is a lanthanum-based dielectric, such as lanthanum oxide (preferably $La_2O_3$) which may be deposited by CVD to a predetermined thickness in the range of 2-5 Angstroms, though other capping oxide layer materials with different thicknesses may be used. For example, a capping oxide layer material may be a metal oxide of group IIA or IIIB elements, such as MgO, SrO, BaO, $Y_2O_3$, and $La_2O_3$, or rare earth oxides formed from scandium, yttrium, or any of the lanthanoid (previously lanthanide) series elements, such as $Gd_2O_3$, $Dy_2O_3$, $Er_2O_3$, etc. As will be appreciated, the capping elements can be deposited as metals as well as metal oxides. In addition, the thickness of the first capping oxide (e.g., $La_2O_3$) is controlled to provide the requisite amount of doping needed to tune the threshold voltage of the finally formed NMOS transistor devices. Thus, the amount of La doping in the high-k film depends on a variety of factors, including the thicknesses of the first capping oxide layer 34 and the gate dielectric layer 32, the materials used to form the first capping oxide layer 34 and the gate dielectric layer 32, and processing details of any subsequent thermal anneal step, and the target threshold voltage shift. For example, in an example implementation, the deposited first capping oxide layer 34 formed on top of a $HfO_2$ gate dielectric layer 32 could be a layer of $La_2O_3$ that is 2 Angstroms thick or that contains an equivalent dosage of Lanthanum (e.g., $5.0 \times 10^{14}$ Lanthanum atoms/$cm^2$) based on the density of the $La_2O_3$ and the thickness of the film.

Figure 4:
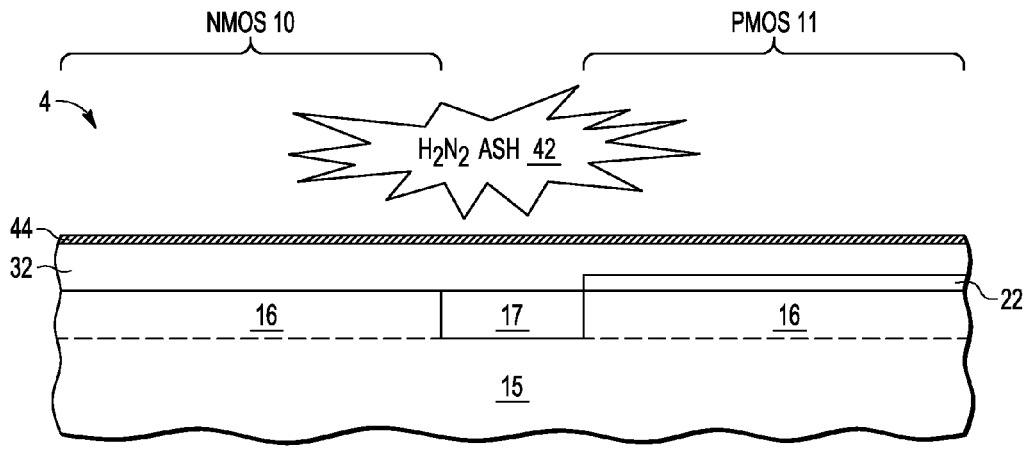
FIG. 4 illustrates processing subsequent to FIG. 3 after the first capping oxide layer surface is treated with an oxygen-free plasma ash.

FIG. 4 illustrates processing of a semiconductor wafer structure 4 subsequent to FIG. 3 after the surface of the first capping oxide layer 34 is treated with an oxygen-free plasma ash process 42 in order to promote adhesion with a subsequently formed photoresist layer. An example of a pre-pattern treatment is a dry plasma process 42 that modifies the surface chemistry of the capping oxide layer 34 so that it becomes a capping layer 44 having a hydrophobic surface. A reducing-type plasma with a gas chemistry of $H_2$ with an inert gas such as argon or nitrogen may be used, and in selected embodiments, an $H_2N_2$ ash process is applied to treat the surface of the capping oxide layer 44. In selected embodiments, a downstream microwave $H_2N_2$ plasma ash process may be used where the plasma in created remotely from the wafer and transported (e.g., in a quartz tube) to the wafer surface. The gas chemistry may be a pre-mixed combination of $H_2N_2$ (i.e. forming gas) or mixed from separate sources of $N_2$ and $H_2$ to create different ratios. To apply the $H_2N_2$ plasma ash, a Mattson Aspen strip platform and Applied Materials Axiom strip chamber may be used, though other platforms may be used. As an example, the following $H_2N_2$ plasma ash process may be used:

Time: approximately 15-25 seconds, and more particularly, approximately 20 seconds;
Pressure: 500-1500 mT, preferably 700 mT;
RF Power: 600-1000 W, preferably 950 W;
Flow: 10-1000 SCCM $H_2N_2$, and more particularly, approximately 500 SCCM; and
Temp.: 200-350° C., and more particularly, approximately 250° C.

One of the benefits of the $H_2N_2$ plasma ash process is that there is reduced defectivity for treated rare earth oxide capping layers, as compared to integration where the capping layers is not treated with a $H_2N_2$ plasma ash process. In addition, a properly engineered $H_2N_2$ plasma ash process does not degrade the electrical properties for hafnium dioxide gate dielectric layers (e.g., Tiny, leakage current metric (Toxgl), mobility, etc.). However, it will be appreciated that other oxygen-free plasma surface treatments may be used to promote photoresist adhesion. Other examples of such reducing treatments to promote similar surface chemistry include, but are not limited to, exposing the dielectric surface to $NH_3$, adding minor amounts of $N_2$ or $NH_3$ to the sputtering ambient for lanthanum when forming the first capping oxide layer 33 to result in the desired dielectric surface as-grown, and the like.

Figure 5:
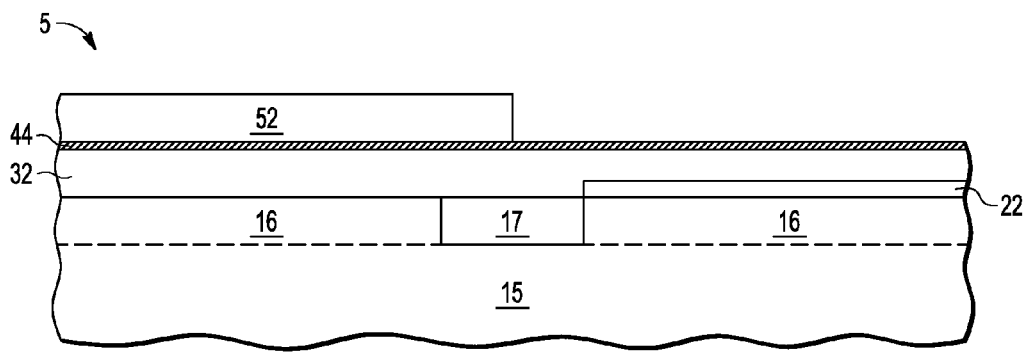
FIG. 5 illustrates processing subsequent to FIG. 4 after a patterned photoresist layer is formed directly on the first capping oxide layer in the NMOS areas.

After treating the first capping oxide layer 34 with an oxygen-free plasma ash process 42 to obtain a capping oxide layer 44 having improved photoresist adhesion properties, with a subsequently formed photoresist layer, a patterned photoresist layer 52 is formed directly on the treated capping oxide layer 44 in the NMOS areas 10, as illustrated in FIG. 5 which illustrates processing of a semiconductor wafer structure 5 subsequent to FIG. 4. As depicted, the patterned photoresist layer 52 is formed by applying and patterning a layer of photoresist directly on the capping oxide layer 44 to mask the NMOS device areas 10. In an example implementation, the photoresist layer may be formed from any appropriate photoresist material (e.g., methacrylate platform) by first depositing the photoresist on the substrate, typically by spin-coating and baking steps. The photoresist is then selectively exposed by illuminating through a patterned photomask with the actinic wavelength, followed by additional baking steps. These steps change the solubility of the exposed photoresist regions relative to the unexposed regions (e.g. for a positive-tone photoresist) such that the exposed regions become soluble in aqueous base developer solution (e.g., $(CH_3)_4NOH$ in $H_2O$). This process of selective exposure and development is used to form the photoresist pattern 52 on the treated capping oxide layer 44. Having previously treated the capping oxide layer to improve its photoresist adhesion properties, the patterned photoresist mask 52 may be formed directly on the gate dielectric layer 44 in a way that allows the photoresist to be reworked without damaging the gate dielectric layer 44.

It is sometimes necessary to rework a photoresist pattern 52. Rework is a process of removing the photoresist and/or BARC material for re-patterning. Pattern re-work can damage the underlying gate dielectric layers if a non-optimized ash process or aqueous oxidizing bath is used for re-work. But by applying an oxygen-free plasma etch process, such as the disclosed $H_2N_2$ ash process, to rework the photoresist pattern 52, damage to the underlying gate dielectric layers 32, 44 is reduced as compared to an oxygen-based plasma etch process.

Figure 6:
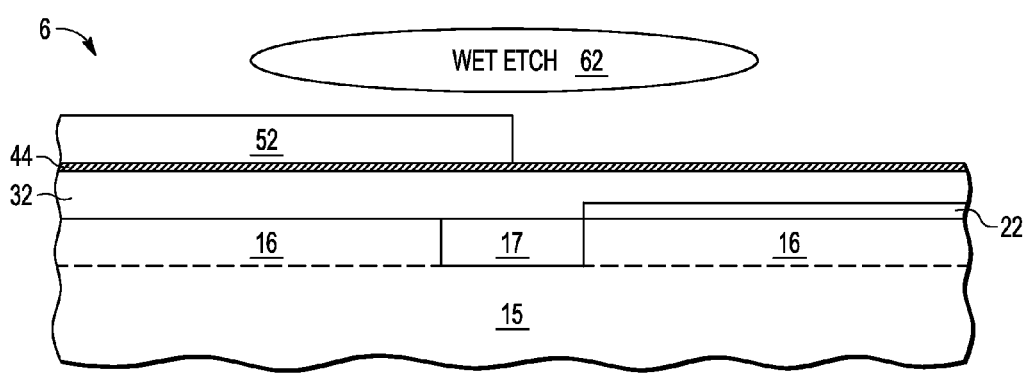
FIG. 6 illustrates processing subsequent to FIG. 5 after the first capping oxide layer is selectively removed from the PMOS areas using the patterned photoresist layer as an etch mask.

Turning now to FIG. 6, there is illustrated processing of a semiconductor wafer structure 6 subsequent to FIG. 5 after the first capping oxide layer 44 is selectively removed from the PMOS areas 11 with an etch process 62 which uses the patterned photoresist layer 52 as an etch mask. In particular, with the patterned photoresist layer 52 in place, the exposed portions of the treated capping oxide layer 44 are selectively etched and removed from the PMOS region 11 using any desired etch process 62, thereby leaving portions of the treated capping oxide layer 44 in the NMOS region 10. Though not shown, it will be appreciated that the exposed treated capping oxide layer 44 may be removed to allow for a second capping layer to be formed over the PMOS region 11 for purposes of separately doping the PMOS devices to tune their threshold voltages. The pattern transfer and etching with the photoresist layer 52 may use one or more etching steps 62 to remove the unprotected portions of the treated capping oxide layer 44, including a dry etching process such as reactive-ion etching, ion beam etching, plasma etching or laser etching, a wet etching process wherein a chemical etchant is employed or any combination thereof. For example, the exposed portion of any treated capping oxide layer 44 may be etched down to the underlying gate dielectric layer 32 using a timed wet etch chemistry process 62 which is specified as follows: 50:1, $H_2O:HCl$ for 5 min.

Figure 7:
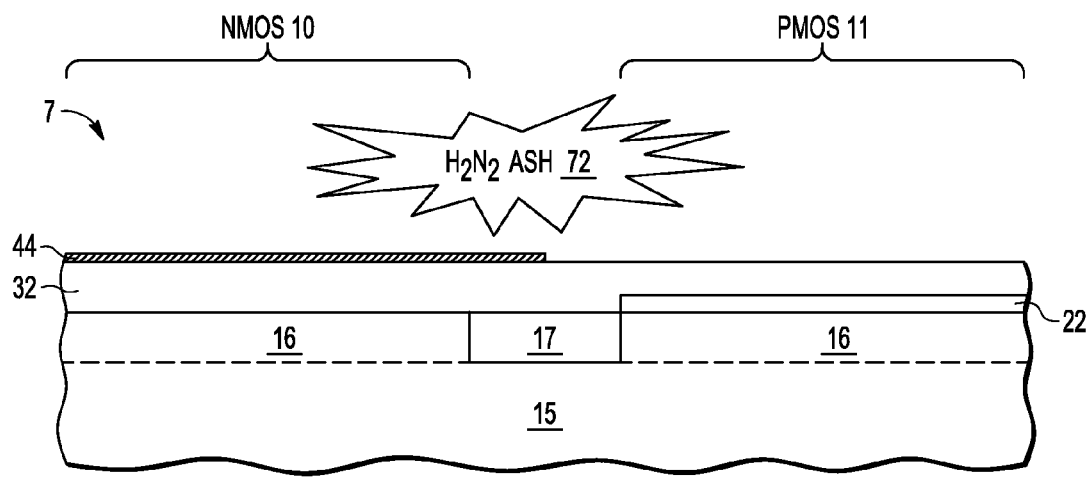
FIG. 7 illustrates processing subsequent to FIG. 6 after the patterned photoresist layer is removed from the semiconductor wafer structure.

FIG. 7 illustrates processing of a semiconductor wafer structure 7 subsequent to FIG. 6 after the patterned photoresist layer 52 is removed from the semiconductor wafer structure using a plasma ash process 72. To strip the patterned photoresist layer 52, a non-oxidizing ash chemistry or solvent-based wet removal process 72 may be used which does not oxidize or damage the underlying gate dielectric layers 32, 44. An example plasma etch process 72 is a reducing-type plasma with a gas chemistry of $H_2$ with an inert gas such as Ar or $N_2$, and in selected embodiments, an $H_2N_2$ ash process is applied to strip the patterned photoresist layer 52. The unetched portion of the treated capping oxide layer 44 may then be used as dopant source to tune the threshold voltage of the NMOS transistor devices. Over at least the PMOS area 11, an additional doped gate dielectric layer (not shown) may be formed, alone or in combination with additional layers (e.g., silicon or metal containing layers), to control the doping of the finally formed PMOS transistor devices.

Figure 8:
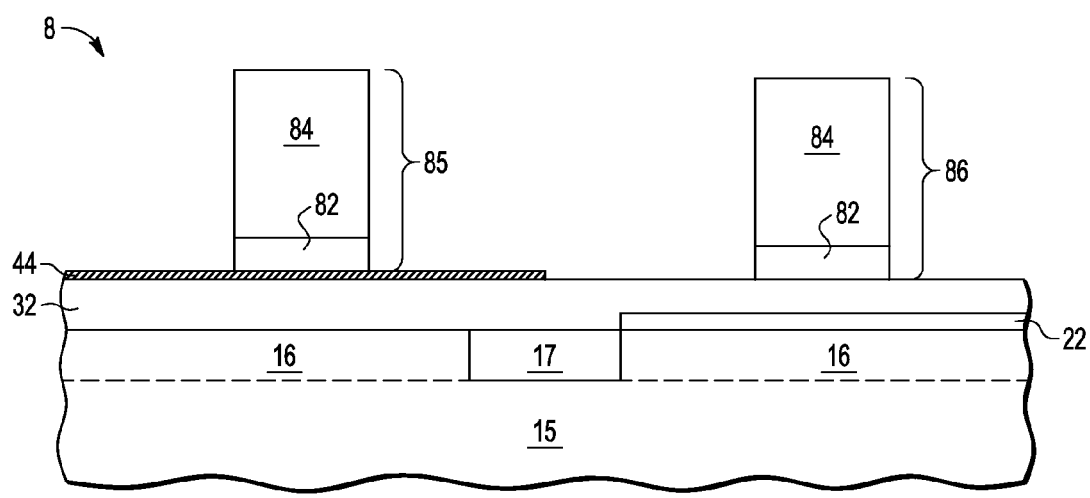
FIG. 8 illustrates processing subsequent to FIG. 7 after multi-layer gate electrodes are formed in the PMOS and NMOS areas.

At this point in the fabrication process, the semiconductor wafer structure is prepared for additional processing steps to form any of a variety of different NMOS and PMOS gate electrode structures, including but not limited to single metal gate integrations, dual metal gate integrations, poly gate integrations, metal/poly gate integrations, etc. To provide but one example, FIG. 8 illustrates processing of a semiconductor wafer structure 8 subsequent to FIG. 7 after single metal gate electrodes 85, 86 are formed in the NMOS and PMOS areas. As illustrated, a single metal gate stack may be formed by sequentially forming a first metal-based layer 82 and a polysilicon gate layer 84 on the exposed high-k gate dielectric layer 32, 44. In this context, a single metal gate stack can refer to forming one or more layers of metal-based materials on both the PMOS and NMOS areas, though a first metal-based layer can be formed on the PMOS area and a second metal-based layer can be formed on the NMOS area which can result in NMOS and PMOS gate stacks having unbalanced heights. In selected embodiments, a first metal-based layer 82 is deposited on the gate dielectric layers 32, 44 using any desired deposition or sputtering process, such as chemical vapor deposition (CVD), plasma-enhanced chemical vapor deposition (PECVD), physical vapor deposition (PVD), atomic layer deposition (ALD), molecular beam deposition (MBD) or any combination(s) thereof A suitable metal-based material for use as the metal-based layer 82 is titanium nitride (e.g., TiN) which may be deposited over the NMOS and PMOS regions to a predetermined thickness of less than 10-100 Angstroms, though other metallic layer materials with different thicknesses may be used. In selected embodiments, the first metal-based layer 82 may include an element selected from the group consisting of Ti, Ta, Hf, Zr, Ir, Mo, Ru, W, Os, Nb, Ti, V, Ni, and Re. In particular, the first metal-based layer 82 may be formed with a metal or metal-based layer (such as TiN, TaC, HfC, TaSi, ZrC, Hf, etc.) or even a conductive metal oxide (such as $IrO_2$).

On the first metal-based layer 82, a semiconductor gate layer 84 is disposed as a silicon-containing layer, such as a polysilicon cap layer or a polysilicon-germanium cap layer that is formed using CVD, PECVD, PVD, ALD, or any combination(s) thereof to form a layer of amorphous silicon 84 to a predetermined thickness in the range of 400-1000 Angstroms (e.g., 600 Angstroms), though other materials and thicknesses may be used. Silicon-containing layer 84 may also be a doped or undoped amorphous silicon or silicon-germanium layer. An anti-reflective coating (ARC) (not shown) may subsequently be formed over silicon-containing gate layer 84 to a thickness in the range of approximately 1-20 nm, though other thicknesses may be used. In a selected embodiment, ARC layer is formed by depositing a silicon-rich silicon nitride layer, an organic ARC, a silicon-oxy nitride, or any ARC material which serves an ARC function for the particular lithography process. As will be appreciated, ARC layer may be applied directly to the silicon-containing layer 84 or as part of a multilayer mask on the silicon-containing layer 84. As deposited, the amorphous silicon layer 84 covers the NMOS and PMOS device areas 10, 11. The deposited silicon-containing layer 84 forms a gate stack that has the same metal layer 84 on both the NMOS and PMOS device areas 10, 11 and that has substantially the same stack height in the NMOS and PMOS device areas 10, 11.

Once the unetched single metal gate stack is formed, an etched gate stack may be formed using any desired pattern and etching processes to form an etched gate stack 82, 84, including application and patterning of photoresist directly on the ARC layer, though multi-layer masking techniques may also be used. Regardless of which etching process is used, FIG. 8 illustrates processing of a semiconductor wafer structure 8 subsequent to FIG. 7 after the single metal gate stack is selectively etched to form NMOS gate electrodes 85 and PMOS gate electrodes 86. As a preliminary step, a gate mask and etch process is performed to pattern the silicon-containing cap layer 84 and underlying metal-based layer 82, resulting in the formation of an etched gate stacks 85, 86 over the substrate 8. The etched NMOS gate stack 85 includes a single metal layer 82 on the lanthanum-doped high-k gate dielectric layer 44 and an overlying silicon-containing cap layer 84, and as a result of the gate dielectric doping, has a negatively shifted threshold voltage and a reduced effective work function. Likewise, the etched PMOS gate stack 86 includes a single metal layer 82 on the high-k gate dielectric layer 32 and an overlying silicon-containing cap layer 84, and as a result of the gate dielectric doping, has a positively shifted threshold voltage and an increased effective work function. The ARC layer may also be initially patterned during the gate stack etch, but it can be fully removed after the gate etch, and thus is not shown in FIG. 8. Because silicon-containing layer 84 serves to protect the metal gate layer 82 during subsequent etches and cleans, there is no need to keep an ARC layer on top of the gates. This is advantageous in that the ARC layer need not later be separately etched during a contact etch process to form a contact to the gate, and instead can be wet etched. Furthermore, complete removal of the ARC layer enables a more robust silicidation process on top of the gate layer 84.

As will be appreciated, additional processing steps may be used to complete the fabrication of the semiconductor devices 85, 86 into functioning NMOS and PMOS transistor devices. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact plugs and multiple levels of interconnect(s) that are used to connect the device components in a desired manner to achieve the desired functionality. Once the wafer fabrication process is completed, the wafer can be singulated or diced into separate integrated circuits dies for subsequent electrical connection, such as by leadframe attachment, wirebonding and encapsulation. Thus, the specific sequence of steps used to complete the fabrication of the device components may vary, depending on the process and/or design requirements.

By now it should be appreciated that there has been provided a method for forming a semiconductor structure. In the disclosed methodology, a first semiconductor layer is provided having a PMOS device area and an NMOS device area. A high-k gate dielectric layer (e.g., $HfO_2$) is formed over the first semiconductor layer in the PMOS and NMOS device areas, and a rare earth oxide capping layer (e.g., $La_2O_3$) is formed on the high-k gate dielectric layer in at least the NMOS device area. Before patterning a photoresist layer, an oxygen-free plasma process is applied to an exposed surface of the rare earth oxide capping layer to modify the surface chemistry of the rare earth oxide capping layer to promote photoresist adhesion. The oxygen-free plasma process may be implemented by performing a pre-pattern surface modification by treating the rare earth oxide capping layer with a reducing plasma comprising hydrogen (e.g., $H_2N_2$) in order to promote photoresist adhesion Thereafter, a patterned photoresist layer is formed directly on the exposed surface of the rare earth oxide capping layer to protect the NMOS device area, and the rare earth oxide capping layer in the PMOS device area is selectively etched using the patterned photoresist layer as an etch mask. After selectively etching the rare earth oxide capping layer, the patterned photoresist layer is stripped to expose a portion of the rare earth oxide capping layer in the NMOS device area, such as by performing a non-oxidizing ash chemistry or solvent-based wet removal process to remove the patterned photoresist layer from the NMOS device area. With the substrate cleared of resist, one or more gate electrode layers are formed over exposed portions of the rare earth oxide capping layer and the high-k gate dielectric layer in the PMOS and NMOS device areas, and the gate electrode layer(s) are selectively etched to form NMOS and PMOS gate electrodes. With the disclosed process, the patterned photoresist layer may be formed directly on the exposed surface of the rare earth oxide capping layer without requiring formation of a developable bottom antireflective coating (dBARC) photoresist layer.

In another form, there is provided a fabrication method of enhancing photoresist adhesion to a rare earth oxide layer. In the disclosed fabrication methodology, a rare earth oxide layer (e.g., lanthanum oxide) is formed or deposited over a high-k gate dielectric layer formed on a semiconductor substrate. A pre-pattern surface modification of the rare earth oxide layer is performed by treating at least a portion of the rare earth oxide layer with an oxygen-free reducing plasma process using $H_2$ with an inert argon or nitrogen gas (e.g., $H_2N_2$) to treat a surface of the rare earth oxide layer for the purpose of promoting photoresist adhesion. In selected embodiments, the pre-pattern surface modification is achieved by exposing the rare earth oxide layer to an $H_2N_2$ plasma ash process for approximately 15-25 seconds under approximately 500-1500 mT of pressure at a temperature of approximately 200-350° C. and a power setting of approximately 600-1000 W using a flow of 10-1000 SCCM $H_2N_2$. A patterned photoresist layer is then formed to directly adhere to an exposed portion of the treated surface of the rare earth oxide layer such that one or more etch portions of the rare earth oxide layer are exposed by the patterned photoresist layer. Using the patterned photoresist layer as an etch mask, the etch portion(s) of the rare earth oxide layer are selectively etched, and the patterned photoresist layer may then be stripped to expose the exposed portion of the treated surface of the rare earth oxide layer, such as by performing a non-oxidizing ash chemistry or solvent-based wet removal process to remove the patterned photoresist layer.

In yet another form, there is provided a method of fabricating an integrated circuit having capping gate dielectric layer over an NMOS device area. As disclosed, the methodology starts by forming a rare earth oxide capping layer on a gate dielectric layer formed in the NMOS device area of a semiconductor substrate. To promote photoresist adhesion, the rare earth oxide capping layer is then subjected to a pre-pattern surface modification by treating the rare earth oxide capping layer with an oxygen free reducing plasma. The pre-pattern surface modification may be performed by applying an $H_2N_2$ ash to produce a hydrophobic surface on the rare earth oxide capping layer that improves adhesion between the patterned photoresist layer and the underlying rare earth oxide capping layer. In selected embodiments, the pre-pattern surface modification is achieved by exposing the rare earth oxide capping layer to an $H_2N_2$ plasma ash process for approximately 15-25 seconds under approximately 500-1500 mT of pressure at a temperature of approximately 200-350° C. and a power setting of approximately 600-1000 W using a flow of 10-1000 SCCM $H_2N_2$. Thereafter, a patterned photoresist layer is formed on the treated rare earth oxide capping layer to expose the treated rare earth oxide capping layer outside the NMOS device area. Using the patterned photoresist layer as an etch mask, an etch is then performed to remove the exposed portion of the treated rare earth oxide capping layer outside the NMOS device area, after which the patterned photoresist layer is removed.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, selected embodiments of the present invention may apply the disclosed fabrication sequence to selectively form an oxide capping layer (e.g., aluminum oxide) over the NMOS and PMOS areas, treating the oxide capping layer with an oxygen-free plasma process prior to directly depositing a patterned photoresist layer over the PMOS areas so that a wet etch process leaves the oxide capping layer over the PMOS areas. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the invention is not limited to any particular type of integrated circuit described herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure, comprising:
providing a first semiconductor layer comprising a PMOS device area and an NMOS device area;
forming a high-k gate dielectric layer over the first semiconductor layer in the PMOS and NMOS device areas;
forming a capping gate oxide layer on the high-k gate dielectric layer in at least the NMOS device area;
applying an oxygen-free plasma process to an exposed surface of the capping gate oxide layer to modify the surface chemistry of the capping gate oxide layer;
forming a patterned photoresist layer directly on the exposed surface of the capping gate oxide layer to protect the NMOS device area; and
selectively etching at least the capping gate oxide layer in the PMOS device area using the patterned photoresist layer as an etch mask.

2. The method of claim 1 where applying the oxygen-free plasma process to the exposed surface of the capping gate oxide layer promotes photoresist adhesion on the exposed surface of the capping gate oxide layer.

3. The method of claim 1 where forming the capping gate oxide layer comprises depositing a layer of metal oxide of group IIA or IIIB elements or a layer of rare earth oxide on the high-k gate dielectric layer.

4. The method of claim 1, where applying an oxygen-free plasma process comprises performing a pre-pattern surface modification by treating the capping gate oxide layer with a reducing plasma comprising hydrogen.

5. The method of claim 4, where the reducing plasma comprises $H_2N_2$.

6. The method of claim 1, further comprising:
stripping the patterned photoresist layer after selectively etching at least the capping gate oxide layer to expose a portion of the capping gate oxide layer in the NMOS device area;
forming one or more gate electrode layers over exposed portions of the capping gate oxide layer and the high-k gate dielectric layer in the PMOS and NMOS device areas; and
selectively etching the one or more gate electrode layers to form NMOS and PMOS gate electrodes.

7. The method of claim 6, where stripping the patterned photoresist layer comprises performing a non-oxidizing ash chemistry or solvent-based wet removal process to remove the patterned photoresist layer from the NMOS device area.

8. The method of claim 1, where the patterned photoresist layer is formed directly on the exposed surface of the capping gate oxide layer without requiring formation of a developable bottom antireflective coating (dBARC) photoresist layer.

9. A method of enhancing photoresist adhesion to a metal oxide layer, comprising:
forming a metal oxide layer over a semiconductor substrate;
performing a pre-pattern surface modification of the metal oxide layer by treating at least a portion of the metal oxide layer with an oxygen-free plasma process, thereby forming a treated surface of the metal oxide layer;
forming a patterned photoresist layer to directly adhere to an exposed portion of the treated surface of the metal oxide layer, thereby exposing one or more etch portions of the metal oxide layer; and
selectively etching at least the one or more etch portions of the metal oxide layer using the patterned photoresist layer as an etch mask.

10. The method of claim 9 where forming the metal oxide layer comprises depositing a layer of metal oxide of group IIA or IIIB elements or a layer of rare earth oxide over a high-k gate dielectric layer formed on the semiconductor substrate.

11. The method of claim 9 where forming the metal oxide layer comprises depositing lanthanum oxide over the semiconductor substrate.

12. The method of claim 9, where performing the pre-pattern surface modification comprises treating the metal oxide layer with a reducing plasma comprising hydrogen in order to promote photoresist adhesion.

13. The method of claim 12, where the reducing plasma comprises $H_2N_2$.

14. The method of claim 9, further comprising:
stripping the patterned photoresist layer after selectively etching at least the one or more etch portions of the metal oxide layer to expose the exposed portion of the treated surface of the metal oxide layer.

15. The method of claim 14, where stripping the patterned photoresist layer comprises performing a non-oxidizing ash chemistry or solvent-based wet removal process to remove the patterned photoresist layer.

16. The method of claim 9, where performing the pre-pattern surface modification of the metal oxide layer comprises plasma treating the metal oxide layer using $H_2$ with an inert argon or nitrogen gas.

17. The method of claim 9, where performing the pre-pattern surface modification of the metal oxide layer comprises exposing the metal oxide layer to an $H_2N_2$ plasma ash process for approximately 15-25 seconds under approximately 500-1500 mT of pressure at a temperature of approximately 200-350° C. and a power setting of approximately 600-1000 W using a flow of 10-1000 SCCM $H_2N_2$.

18. A method of fabricating an integrated circuit having a rare earth capping gate oxide layer over an NMOS device area, comprising:
forming a gate dielectric over a semiconductor substrate;
forming a rare earth capping gate oxide layer on the gate dielectric layer in at least the NMOS device area;
performing a pre-pattern surface modification by treating the rare earth capping gate oxide layer with an oxygen free reducing plasma;
forming a patterned photoresist layer on the treated rare earth capping gate oxide layer to expose a portion of the treated rare earth capping gate oxide layer outside the NMOS device area;
etching the treated rare earth capping gate oxide layer outside the NMOS device area using the patterned photoresist layer; and
removing the patterned photoresist layer.

19. The method of claim 18, where performing the pre-pattern surface modification comprises applying an $H_2N_2$ ash to produce a hydrophobic surface on the rare earth capping gate oxide layer that improves adhesion between the patterned photoresist layer and the underlying rare earth capping gate oxide layer.

20. The method of claim 18, where performing the pre-pattern surface modification comprises exposing the rare earth capping gate oxide layer to an $H_2N_2$ plasma ash process for approximately 15-25 seconds under approximately 500-1500 mT of pressure at a temperature of approximately 200-350° C. and a power setting of approximately 600-1000 W using a flow of 10-1000 SCCM $H_2N_2$.

* * * * *